(12) United States Patent
Uejima et al.

(10) Patent No.: US 12,445,159 B2
(45) Date of Patent: Oct. 14, 2025

(54) RADIO FREQUENCY MODULE AND COMMUNICATION DEVICE

(71) Applicant: Murata Manufacturing Co., Ltd., Kyoto (JP)

(72) Inventors: Takanori Uejima, Kyoto (JP); Hiromichi Kitajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 426 days.

(21) Appl. No.: 18/302,858

(22) Filed: Apr. 19, 2023

(65) Prior Publication Data
US 2023/0308128 A1 Sep. 28, 2023

Related U.S. Application Data

(63) Continuation of application No. PCT/JP2021/036701, filed on Oct. 4, 2021.

(30) Foreign Application Priority Data

Nov. 13, 2020 (JP) ................. 2020-189602

(51) Int. Cl.
*H04B 1/38* (2015.01)
*H01L 23/31* (2006.01)
(Continued)

(52) U.S. Cl.
CPC ........... *H04B 1/38* (2013.01); *H01L 23/3121* (2013.01); *H01L 23/552* (2013.01); *H01L 23/66* (2013.01);
(Continued)

(58) Field of Classification Search
CPC ... H01L 25/18; H01L 23/3121; H01L 23/552; H01L 23/66; H01L 2223/6655; H03H 9/05; H04B 1/38
See application file for complete search history.

(56) References Cited

U.S. PATENT DOCUMENTS 6,335,669 B1 * 1/2002 Miyazaki ............ H01L 25/0657
257/723
9,419,667 B2 * 8/2016 Lobianco ............ H01L 23/3121
(Continued)

FOREIGN PATENT DOCUMENTS

JP 2020-126921 A 8/2020
WO 2016/181954 A1 11/2016
(Continued)

OTHER PUBLICATIONS

International Search Report for PCT/JP2021/036701 dated Dec. 28, 2021.

*Primary Examiner* — Hai V Nguyen
(74) *Attorney, Agent, or Firm* — McDonald Hopkins LLC

(57) ABSTRACT

A radio frequency module includes a module substrate, a first component disposed on a principal surface side of the module substrate, a metal shield wall disposed on an upper surface of the first component and set to ground potential, a resin member covering the principal surface of the module substrate, the upper surface and a side surface of the first component, and a side surface of the metal shield wall, and a metal shield layer set to the ground potential and covering an upper surface of the resin member. An upper end of the metal shield wall is in contact with the metal shield layer. The first component includes a first terminal and a second terminal both connected to the module substrate. When the principal surface is viewed in plan, the metal shield wall is disposed between the first terminal and the second terminal.

20 Claims, 4 Drawing Sheets

(51) Int. Cl.
  *H01L 23/552* (2006.01)
  *H01L 23/66* (2006.01)
  *H01L 25/18* (2023.01)
  *H03H 9/05* (2006.01)

(52) U.S. Cl.
  CPC ........... *H01L 25/18* (2013.01); *H03H 9/0566* (2013.01); *H01L 2223/6655* (2013.01)

(56) References Cited

U.S. PATENT DOCUMENTS

| | | | |
|---|---|---|---|
| 9,788,466 B2* | 10/2017 | Chen | H05K 1/183 |
| 9,807,882 B1* | 10/2017 | Berdy | H01L 23/49822 |
| 10,667,381 B2* | 5/2020 | Otsubo | H01L 23/552 |
| 10,979,087 B1* | 4/2021 | Shinozaki | H04B 1/0053 |
| 11,205,833 B2* | 12/2021 | Wang | H01Q 5/314 |
| 11,282,797 B2* | 3/2022 | Nomura | H05K 3/28 |
| 11,419,211 B2* | 8/2022 | Sato | H05K 3/40 |
| 11,532,568 B2* | 12/2022 | Chiu | H01L 24/32 |
| 11,621,228 B2* | 4/2023 | Li | H05K 1/185 |
| | | | 257/774 |
| 11,631,659 B2* | 4/2023 | Tsuda | H01L 25/105 |
| | | | 455/575.7 |
| 11,961,805 B2* | 4/2024 | Chen | H01L 24/49 |
| 11,984,857 B2* | 5/2024 | Wallis | H03F 1/22 |
| 12,003,025 B2* | 6/2024 | Nguyen | H01L 23/552 |
| 12,046,810 B2* | 7/2024 | Uejima | H01L 23/00 |
| 12,055,633 B2* | 8/2024 | Shi | H05K 9/0024 |
| 12,317,412 B2* | 5/2025 | Sawada | H03F 3/72 |
| 2001/0030059 A1* | 10/2001 | Sugaya | H01L 21/56 |
| | | | 257/E23.125 |
| 2014/0002188 A1* | 1/2014 | Chen | H01L 23/49866 |
| | | | 330/250 |
| 2014/0307394 A1* | 10/2014 | Lobianco | H01L 21/565 |
| | | | 361/728 |
| 2014/0308907 A1* | 10/2014 | Chen | H05K 1/0216 |
| | | | 361/728 |
| 2018/0092257 A1 | 3/2018 | Otsubo et al. | |
| 2019/0189801 A1* | 6/2019 | Vedula | H10D 30/023 |
| 2019/0274212 A1* | 9/2019 | Otsubo | H05K 1/0216 |
| 2019/0371891 A1* | 12/2019 | Goktepeli | H01L 21/30625 |
| 2020/0204175 A1* | 6/2020 | Liang | H01L 23/50 |
| 2020/0212535 A1* | 7/2020 | Wang | H01Q 5/314 |
| 2020/0251459 A1* | 8/2020 | Tsuda | H01L 23/66 |
| 2021/0043583 A1* | 2/2021 | Nomura | H05K 3/28 |
| 2021/0091796 A1* | 3/2021 | Shinozaki | H04B 1/0053 |
| 2021/0280503 A1 | 9/2021 | Sato et al. | |
| 2021/0375814 A1* | 12/2021 | Zuo | H01L 21/565 |
| 2023/0198478 A1* | 6/2023 | Kitajima | H03F 3/245 |
| | | | 455/73 |
| 2023/0199939 A1* | 6/2023 | Uejima | H01L 23/552 |
| | | | 361/761 |
| 2023/0208020 A1* | 6/2023 | Uejima | H04B 1/38 |
| | | | 343/702 |
| 2023/0208467 A1* | 6/2023 | Uejima | H03F 3/245 |
| 2023/0209788 A1* | 6/2023 | Hayashi | H05K 9/0032 |
| | | | 361/807 |
| 2023/0261682 A1* | 8/2023 | Uejima | H01L 23/28 |
| | | | 455/552.1 |

FOREIGN PATENT DOCUMENTS

| | | |
|---|---|---|
| WO | 2019/216299 A1 | 11/2019 |
| WO | 2020/110578 A1 | 6/2020 |

\* cited by examiner

RADIO FREQUENCY MODULE AND COMMUNICATION DEVICE

CROSS REFERENCE TO RELATED APPLICATION

This is a continuation of International Application No. PCT/JP2021/036701 filed on Oct. 4, 2021, which claims priority from Japanese Patent Application No. 2020-189602 filed on Nov. 13, 2020. The contents of these applications are incorporated herein by reference in their entireties.

FIELD OF THE DISCLOSURE

The present disclosure relates to a radio frequency module and a communication device.

DESCRIPTION OF THE RELATED ART

Patent Document 1 discloses a radio frequency module including a wiring board, a plurality of components mounted on the wiring board, a sealing resin layer for mounting the plurality of components, and a shield wall. The shield wall is disposed between two adjacent components among the plurality of components. This configuration suppresses the noise interference between the components.

Patent Document 1: International Publication No. 2016/181954

BRIEF SUMMARY OF THE DISCLOSURE

However, the conventional radio frequency module described above does not sufficiently reduce the noise interference in some cases. In addition, the conventional radio frequency module requires an area on the wiring board where the shield wall is disposed, resulting in a smaller mounting area for the components.

Thus, the present disclosure provides a radio frequency module and a communication device capable of ensuring a mounting area for components and enhancing an effect of reducing the noise interference.

A radio frequency module according to one aspect of the present disclosure includes a module substrate, a first component disposed on a principal surface side of the module substrate, a first metal wall disposed on an upper surface of the first component and set to ground potential, a resin member covering the principal surface of the module substrate, the upper surface and a side surface of the first component, and a side surface of the first metal wall, and a metal layer set to the ground potential and covering an upper surface of the resin member, in which an upper end of the first metal wall is in contact with the metal layer, the first component includes a first terminal and a second terminal both connected to the module substrate, and when the principal surface is viewed in plan, the first metal wall is disposed between the first terminal and the second terminal.

A communication device according to an aspect of the present disclosure includes an RF signal processing circuit configured to process a radio frequency signal transmitted and received by an antenna, and a radio frequency module configured to transmit the radio frequency signal between the antenna and the RF signal processing circuit.

According to the present disclosure, the mounting area for components can be ensured and an effect of reducing the noise interference can be enhanced.

DETAILED DESCRIPTION OF THE DISCLOSURE

Figure 1:
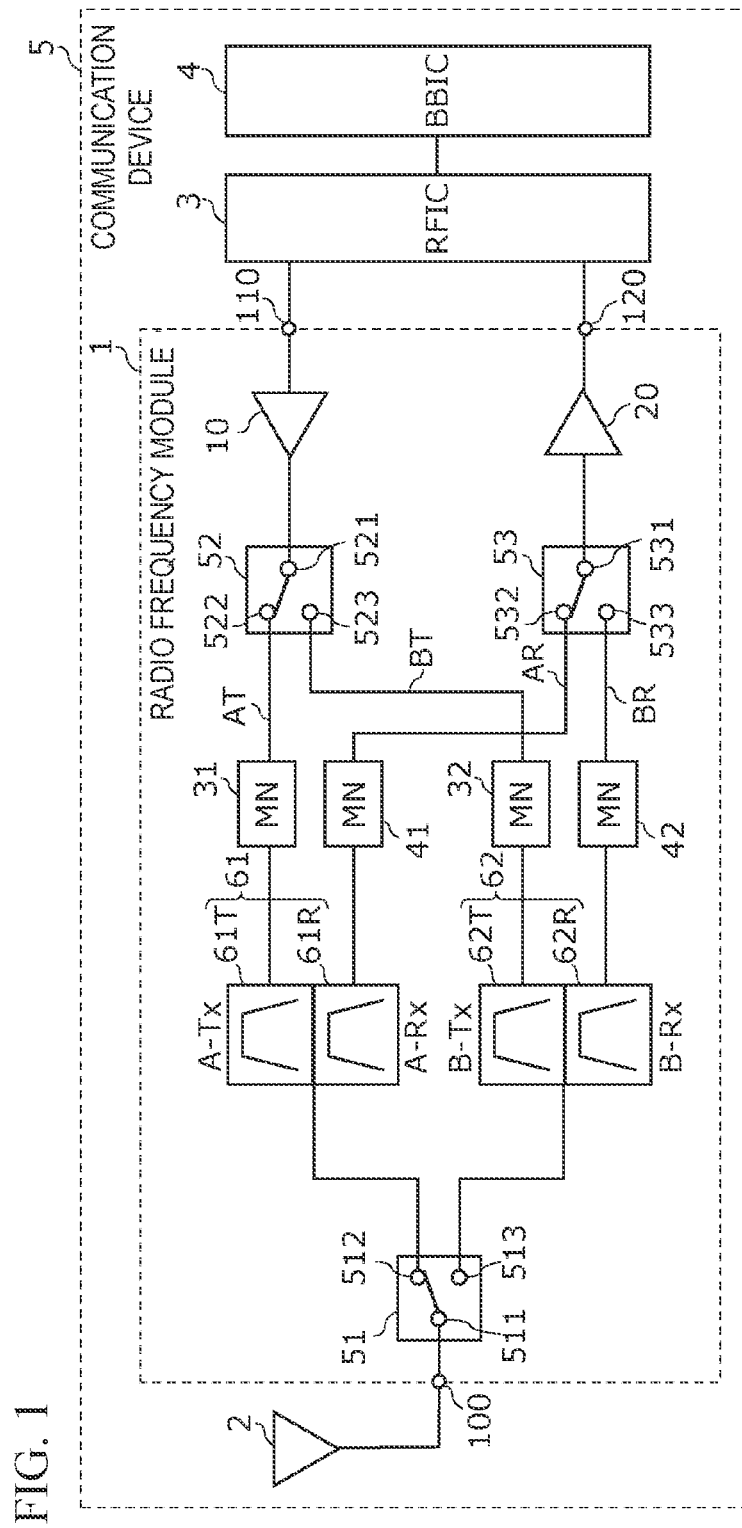
FIG. 1 is a circuit configuration diagram of a radio frequency module and a communication device according to Embodiment.

Hereinafter, a radio frequency module and a communication device according to Embodiment of the present disclosure will be described in detail with reference to the drawings. Note that each of the embodiments described below is a specific example of the present disclosure. Thus, numerical values, shapes, materials, constituent elements, arrangement and connection of the constituent elements, and the like illustrated in the following embodiments are examples, and are not intended to limit the present disclosure. Therefore, among the constituent elements in the following embodiments, constituent elements not described in independent claims are described as optional constituent elements.

In addition, the drawings are schematic diagrams and are not necessarily strictly illustrated. Thus, for example, scales and the like do not necessarily match in the drawings. In the drawings, substantially the same components are denoted by the same reference numerals, and redundant descriptions thereof will be omitted or simplified.

In this specification, terms indicating relationships between elements such as parallel or perpendicular, terms indicating shapes of elements such as rectangles or straight lines, and numerical ranges are not expressions representing only strict meanings, but expressions representing substantially equivalent ranges, for example, expressions including differences of several percent.

In this specification, the terms "upper" and "lower" do not refer to an upward direction (vertically upward) and a downward direction (vertically downward) in absolute spatial recognition, but are used as terms defined by relative positional relationships based on a layering order in a layered configuration. Thus, for example, an "upper surface" or a "top surface" of a component or a member can be any of surfaces in various directions in actual use. The "top surface" of a component or a member means the uppermost surface of the component or the member. In this specification, a side on which a first component is provided with respect to a module substrate is referred to as "upper (or upper side)", and a direction opposite thereto is referred to as "lower (or lower side)".

In this specification and the drawings, an x-axis, a y-axis, and a z-axis represent three axes of a three-dimensional Cartesian coordinate system. When the module substrate is a rectangle when viewed in plan, the x-axis and the y-axis are directions parallel to a first side of the rectangle and a second side orthogonal to the first side, respectively. The z-axis is a thickness direction of the module substrate. In this specification, the "thickness direction" of the module substrate refers to a direction perpendicular to a principal surface of the module substrate.

In this specification, "connected" includes not only when directly connected by a connection terminal and/or a wiring conductor, but also when electrically connected via another circuit element. In addition, "connected between A and B" means connected to both A and B between A and B.

In the component arrangement in the present disclosure, "the module substrate is viewed in plan" is synonymous with "the principal surface of the module substrate is viewed in plan", and means that an object is orthographically projected onto an xy plane from a positive side of the z-axis. In this specification, unless otherwise specified, "viewed in plan" means "the principal surface of the module substrate is viewed in plan".

"The component is disposed on a principal surface side of the substrate" includes "the component is disposed on the principal surface of the substrate in contact with the principal surface" as well as "the component is disposed above the principal surface without being in contact with the principal surface" and "the component is partially embedded in the substrate from the principal surface side". Further, "A is disposed between B and C" means that at least one of multiple line segments connecting points in B and points in C passes through A.

In this specification, ordinal numbers such as "first" and "second" do not mean the number or order of constituent elements unless otherwise specified, and are used to distinguish between constituent elements of the same type so that they are not confused.

EMBODIMENT

1. Circuit Configurations of Radio Frequency Module and Communication Device

Circuit configurations of the radio frequency module and the communication device according to Embodiment will be described with reference to FIG. 1. FIG. 1 is a circuit configuration diagram of a radio frequency module 1 and a communication device 5 according to the present embodiment.

1-1. Circuit Configuration of Communication Device

First, the circuit configuration of the communication device 5 will be described. The communication device 5 is a device used in a communication system and is, for example, a mobile terminal such as a smartphone or a tablet computer. As illustrated in FIG. 1, the communication device 5 according to the present embodiment includes the radio frequency module 1, an antenna 2, an RF signal processing circuit (RFIC) 3, and a baseband signal processing circuit (BBIC) 4.

The radio frequency module 1 transmits radio frequency signals between the antenna 2 and the RFIC 3. An internal configuration of the radio frequency module 1 will be described later.

The antenna 2 is connected to an antenna connection terminal 100 of the radio frequency module 1, transmits a radio frequency signal (transmit signal) outputted from the radio frequency module 1, and also receives a radio frequency signal (receive signal) from the outside and outputs the radio frequency signal to the radio frequency module 1.

The RFIC 3 is an example of a signal processing circuit that processes radio frequency signals transmitted and received by the antenna 2. To be specific, the RFIC 3 processes a radio frequency receive signal inputted via a receive path of the radio frequency module 1 by down-conversion or the like, and outputs a receive signal generated by the signal processing to the BBIC 4. In addition, the RFIC 3 processes a transmit signal inputted from the BBIC 4 by up-conversion or the like, and outputs a radio frequency transmit signal generated by the signal processing to a transmit path of the radio frequency module 1. Further, the RFIC 3 includes a control section that controls switches, amplifiers, and the like of the radio frequency module 1. Note that some or all of the functions of the RFIC 3 as the control section may be implemented outside the RFIC 3, for example, in the BBIC 4 or the radio frequency module 1.

The BBIC 4 is a baseband signal processing circuit that processes signals using an intermediate frequency band for frequencies lower than the frequency of the radio frequency signals transmitted by the radio frequency module 1. Signals to be processed by the BBIC 4 are, for example, image signals for displaying images and/or audio signals for calling through a speaker.

In the communication device 5 according to the present embodiment, the antenna 2 and the BBIC 4 are not essential constituent elements.

1-2. Circuit Configuration of Radio Frequency Module

Next, a circuit configuration of the radio frequency module 1 will be described. As illustrated in FIG. 1, the radio frequency module 1 includes a power amplifier 10, a low noise amplifier 20, matching circuits 31, 32, 41, and 42, switches 51 to 53, duplexers 61 and 62, the antenna connection terminal 100, a radio frequency input terminal 110, and a radio frequency output terminal 120.

The antenna connection terminal 100 is connected to the antenna 2.

The radio frequency input terminal 110 is a terminal for receiving a radio frequency transmit signal from the outside of the radio frequency module 1. In the present embodiment, the radio frequency input terminal 110 is a terminal for receiving transmit signals in communication bands A and B from the RFIC 3.

The radio frequency output terminal 120 is a terminal for providing radio frequency receive signals to the outside of the radio frequency module 1. In the present embodiment, the radio frequency output terminal 120 is a terminal for providing receive signals in the communication bands A and B to the RFIC 3.

The communication band means a frequency band predefined by, for example, a standardization organization (e.g., 3rd Generation Partnership Project (3GPP) and Institute of Electrical and Electronics Engineers (IEEE)) for a communication system. Here, the communication system means a communication system constructed by using a radio access technology (RAT). As the communication system, for example, a 5th Generation New Radio (5G NR) system, a Long Term Evolution (LTE) system, and a Wireless Local Area Network (WLAN) system can be used, but the communication system is not limited thereto.

The communication bands A and B are communication bands different from each other. In the present embodiment, communication bands for frequency division duplex (FDD) are used as the communication bands A and B. As at least one of the communication bands A and B, a communication band for time division duplex (TDD) may be used.

The radio frequency module 1 is provided with the transmit path for transmitting a transmit signal and the receive path for transmitting a receive signal. Specifically, as illustrated in FIG. 1, transmit paths AT and BT and receive paths AR and BR are provided.

The transmit path AT is a path through which transmit signals in the communication band A are transmitted, and is a path of the two signal paths connecting the radio frequency input terminal 110 and the antenna connection terminal 100, in which the power amplifier 10, the switch 52, the matching circuit 31, a transmit filter 61T, and the switch 51 are arranged. The transmit path BT is a path through which transmit signals in the communication band B are transmitted, and is a path of the two signal paths connecting the radio frequency input terminal 110 and the antenna connection terminal 100, in which the power amplifier 10, the switch 52, the matching circuit 32, a transmit filter 62T, and the switch 51 are arranged. The transmit paths AT and BT are unified between the radio frequency input terminal 110 and the switch 52 and between the switch 51 and the antenna connection terminal 100.

The receive path AR is a path through which receive signals in the communication band A are transmitted. The receive path AR is a path of the two signal paths connecting the antenna connection terminal 100 and the radio frequency output terminal 120, in which the switch 51, a receive filter 61R, the matching circuit 41, the switch 53, and the low noise amplifier 20 are arranged. The receive path BR is a path through which receive signals in the communication band B are transmitted, and is a path of the two signal paths connecting the antenna connection terminal 100 and the radio frequency output terminal 120, in which the switch 51, a receive filter 62R, the matching circuit 42, the switch 53, and the low noise amplifier 20 are arranged. The receive paths AR and BR are unified between the antenna connection terminal 100 and the switch 51 and between the switch 53 and the radio frequency output terminal 120. The path between the antenna connection terminal 100 and the switch 51 is a path common to the transmit path and the receive path, and is also referred to as a transmit/receive path that transmits both the transmit signal and the receive signal.

The power amplifier 10 can amplify transmit signals in the communication bands A and B. Here, an input terminal of the power amplifier 10 is connected to the radio frequency input terminal 110, and an output terminal of the power amplifier 10 is connected to the switch 52.

The configuration of the power amplifier 10 is not limited to a specific configuration. For example, the power amplifier 10 may have a single-stage configuration or a multi-stage configuration. For example, the power amplifier 10 may include multiple cascade-connected amplifying elements. The power amplifier 10 may convert a radio frequency signal into balanced signals and amplify the balanced signals. Such a power amplifier 10 is sometimes referred to as a differential amplifier. "Balanced signals" means a pair of signals having phases opposite to each other. "Balanced signals" is sometimes referred to as differential signals.

The low noise amplifier 20 can amplify receive signals in the communication bands A and B received by the antenna connection terminal 100. Here, an input terminal of the low noise amplifier 20 is connected to the switch 53, and an output terminal of the low noise amplifier 20 is connected to the radio frequency output terminal 120.

The configuration of the low noise amplifier 20 is not limited to a specific configuration. For example, the low noise amplifier 20 may have a single-stage configuration or a multi-stage configuration.

Each of the power amplifier 10 and the low noise amplifier 20 is configured using, for example, a Si-based CMOS or a GaAs field-effect transistor (FET) or a GaAs heterojunction bipolar transistor (HBT).

The duplexer 61 is an example of a filter having a pass band including the communication band A. The duplexer 61 passes radio frequency signals in the communication band A. The duplexer 61 transmits a transmit signal and a receive signal in the communication band A by the FDD system. The duplexer 61 includes the transmit filter 61T and the receive filter 61R.

The transmit filter 61T has a pass band that includes an uplink operating band in the communication band A. One end of the transmit filter 61T is connected to the antenna connection terminal 100 via the switch 51. The other end of the transmit filter 61T is connected to the output terminal of the power amplifier 10 via the matching circuit 31 and the switch 52.

The "uplink operating band" refers to part of a communication band designated for an uplink. For the radio frequency module 1, the uplink operating band means a transmission band.

The receive filter 61R has a pass band that includes a downlink operating band in the communication band A. One end of the receive filter 61R is connected to the antenna connection terminal 100 via the switch 51. The other end of the receive filter 61R is connected to the input terminal of the low noise amplifier 20 via the matching circuit 41 and the switch 53.

The "downlink operating band" refers to part of a communication band designated for a downlink. For the radio frequency module 1, the downlink operating band means a reception band.

The duplexer 62 is an example of a filter having a pass band including the communication band B. The duplexer 62 passes radio frequency signals in the communication band B. The duplexer 62 transmits a transmit signal and a receive signal in the communication band B by the FDD system. The duplexer 62 includes the transmit filter 62T and the receive filter 62R.

The transmit filter 62T has a pass band that includes an uplink operating band in the communication band B. One end of the transmit filter 62T is connected to the antenna connection terminal 100 via the switch 51. The other end of the transmit filter 62T is connected to the output terminal of the power amplifier 10 via the matching circuit 32 and the switch 52.

The receive filter 62R has a pass band that includes a downlink operating band in the communication band B. One end of the receive filter 62R is connected to the antenna connection terminal 100 via the switch 51. The other end of the receive filter 62R is connected to the input terminal of the low noise amplifier 20 via the matching circuit 42 and the switch 53.

Each of the transmit filters 61T and 62T and the receive filters 61R and 62R is, for example, any one of an acoustic wave filter using surface acoustic waves (SAW), an acoustic wave filter using bulk acoustic waves (BAW), an LC resonance filter, and a dielectric filter, but is not limited thereto.

The switch 51 is connected between the antenna connection terminal 100 and each of the duplexers 61 and 62. The switch 51 is also referred to as an antenna switch. To be specific, the switch 51 includes terminals 511 to 513. The terminal 511 is a common terminal connected to the antenna connection terminal 100. The terminal 512 is a selection terminal connected to the transmit filter 61T and the receive filter 61R. The terminal 513 is a selection terminal connected to the transmit filter 62T and the receive filter 62R.

The switch 51 can connect one of the terminal 512 and the terminal 513 to the terminal 511 based on, for example, a control signal from the RFIC 3. Thus, the switch 51 switches between (a) the connection between the antenna connection terminal 100 and both the transmit filter 61T and the receive filter 61R and (b) the connection between the antenna connection terminal 100 and both the transmit filter 62T and the receive filter 62R. The switch 51 is, for example, a single-pole double-throw (SPDT) switch circuit. Note that the switch 51 may be a multi-connection switch circuit capable of simultaneously performing the connections (a) and (b).

The switch 52 is connected between each of the duplexers 61 and 62 and the power amplifier 10. To be specific, the switch 52 includes terminals 521 to 523. The terminal 521 is a common terminal connected to the output terminal of the power amplifier 10. The terminal 522 is a selection terminal connected to the transmit filter 61T via the matching circuit 31. The terminal 523 is a selection terminal connected to the transmit filter 62T via the matching circuit 32.

The switch 52 can connect one of the terminal 522 and the terminal 523 to the terminal 521 based on, for example, a control signal from the RFIC 3. Thus, the switch 52 switches between the connection between the power amplifier 10 and the transmit filter 61T and the connection between the power amplifier 10 and the transmit filter 62T. The switch 52 is, for example, an SPDT switch circuit.

The switch 53 is connected between each of the duplexers 61 and 62 and the low noise amplifier 20. To be specific, the switch 53 includes terminals 531 to 533. The terminal 531 is a common terminal connected to the input terminal of the low noise amplifier 20. The terminal 532 is a selection terminal connected to the receive filter 61R via the matching circuit 41. The terminal 533 is a selection terminal connected to the receive filter 62R via the matching circuit 42.

The switch 53 can connect one of the terminal 532 and the terminal 533 to the terminal 531 based on, for example, a control signal from the RFIC 3. Thus, the switch 53 switches between the connection between the low noise amplifier 20 and the receive filter 61R and the connection between the low noise amplifier 20 and the receive filter 62R. The switch 53 is, for example, an SPDT switch circuit.

The matching circuit 31 is connected between the transmit filter 61T and the output terminal of the power amplifier 10. To be specific, the matching circuit 31 is connected between the transmit filter 61T and the terminal 522 of the switch 52. The matching circuit 31 matches the impedance between the transmit filter 61T and the power amplifier 10.

The matching circuit 32 is connected between the transmit filter 62T and the output terminal of the power amplifier 10. To be specific, the matching circuit 32 is connected between the transmit filter 62T and the terminal 523 of the switch 52. The matching circuit 32 matches the impedance between the transmit filter 62T and the power amplifier 10.

The matching circuit 41 is connected between the receive filter 61R and the input terminal of the low noise amplifier 20. To be specific, the matching circuit 41 is connected between the receive filter 61R and the terminal 532 of the switch 53. The matching circuit 41 matches the impedance between the receive filter 61R and the low noise amplifier 20.

The matching circuit 42 is connected between the receive filter 62R and the input terminal of the low noise amplifier 20. To be specific, the matching circuit 42 is connected between the receive filter 62R and the terminal 533 of the switch 53. The matching circuit 42 matches the impedance between the receive filter 62R and the low noise amplifier 20.

Each of the matching circuits 31, 32, 41, and 42 is formed using at least one of an inductor, a capacitor, and a resistor. For example, each of the matching circuits 31, 32, 41, and 42 includes a chip inductor.

In place of or in addition to the matching circuits 31 and 32, a matching circuit may be provided between the terminal 521 of the switch 52 and the output terminal of the power amplifier 10. In place of or in addition to the matching circuits 41 and 42, a matching circuit may be provided between the terminal 531 of the switch 53 and the input terminal of the low noise amplifier 20. A matching circuit may be provided between the terminal 512 of the switch 51 and the duplexer 61. A matching circuit may be provided between the terminal 513 of the switch 51 and the duplexer 62.

In the radio frequency module 1 having the above circuit configuration, the power amplifier 10, the switch 52, the matching circuit 31, and the transmit filter 61T constitute a first transmission circuit that outputs a transmit signal in the communication band A to the antenna connection terminal 100. The power amplifier 10, the switch 52, the matching circuit 32, and the transmit filter 62T constitute a second transmission circuit that outputs a transmit signal in the communication band B to the antenna connection terminal 100.

The low noise amplifier 20, the switch 53, the matching circuit 41, and the receive filter 61R constitute a first reception circuit that receives a receive signal in the communication band A from the antenna 2 via the antenna connection terminal 100. The low noise amplifier 20, the switch 53, the matching circuit 42, and the receive filter 62R constitute a second reception circuit that receives a receive signal in the communication band B from the antenna 2 via the antenna connection terminal 100.

According to the above circuit configuration, the radio frequency module 1 according to the present embodiment can perform at least one of (1) transmission and reception of radio frequency signals in the communication band A, (2) transmission and reception of radio frequency signals in the communication band B, and (3) simultaneous transmission, simultaneous reception, or simultaneous transmission and reception of radio frequency signals in the communication band A and radio frequency signals in the communication band B.

In the radio frequency module 1 according to the present embodiment, the transmission circuit and the reception circuit do not necessarily have to be connected to the antenna connection terminal 100 via the switch 51, and the transmission circuit and the reception circuit may be connected to the antenna 2 via different terminals.

Some of the circuit elements illustrated in FIG. 1 do not necessarily have to be included in the radio frequency module 1. For example, the radio frequency module 1 may include only transmission circuits that transmit the transmit signals. In this case, the radio frequency module 1 does not have to include the low noise amplifier 20, the matching circuits 41 and 42, the switch 53, and the receive filters 61R and 62R. The radio frequency module 1 may include only reception circuits that transmit the receive signals. In this case, the radio frequency module 1 does not have to include the power amplifier 10, the matching circuits 31 and 32, the switch 52, and the transmit filters 61T and 62T. The radio frequency module 1 may transmit radio frequency signals in only one communication band. In this case, the radio frequency module 1 does not have to include the switch 51, the matching circuits 32 and 42, and the duplexer 62.

2. Component Arrangement in Radio Frequency Module

Next, an example of component arrangement in the radio frequency module 1 will be described with reference to FIGS. 2 to 4.

Figure 2:
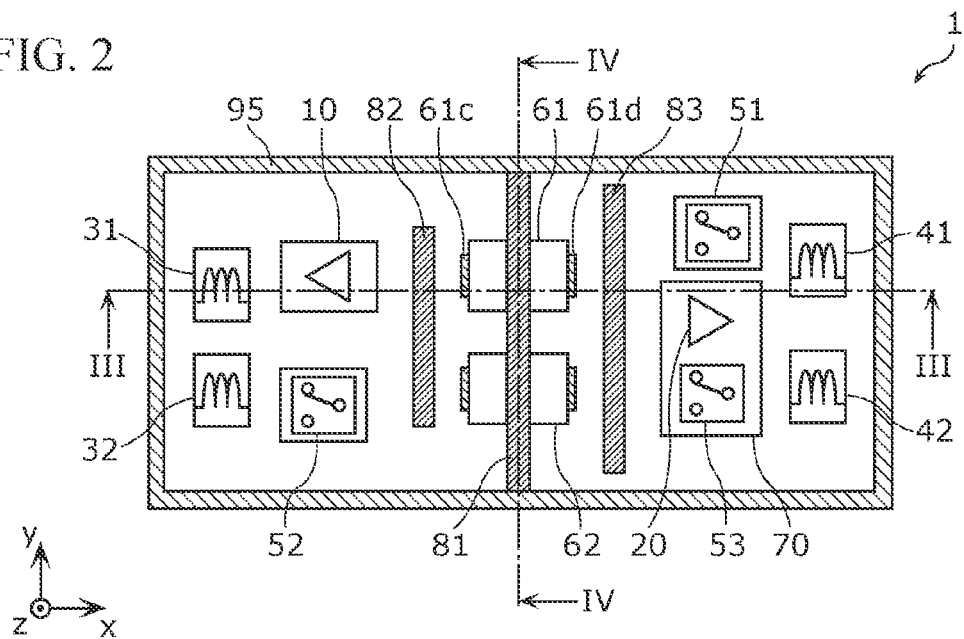
FIG. 2 is a plan view of the radio frequency module according to Embodiment.

FIG. 2 is a plan view of the radio frequency module 1 according to the present embodiment. FIGS. 3 and 4 are sectional views of the radio frequency module 1. FIG. 3 illustrates a cross section (xz plane) taken along line III-III in FIG. 2. FIG. 4 illustrates a cross section (yz plane) taken along line IV-IV in FIG. 2. In FIGS. 3 and 4, a cross section of a module substrate 91 is not hatched for the sake of clarity.

Figure 3:
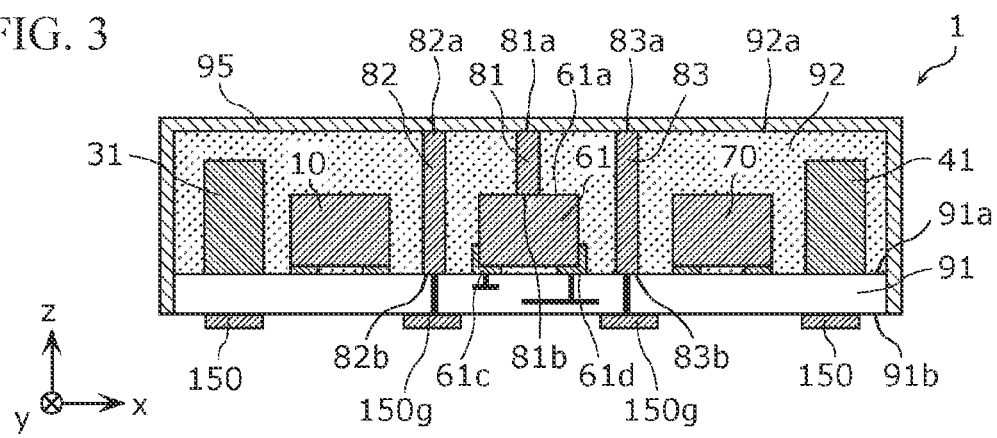
FIG. 3 is a sectional view of the radio frequency module according to Embodiment.
Figure 4:
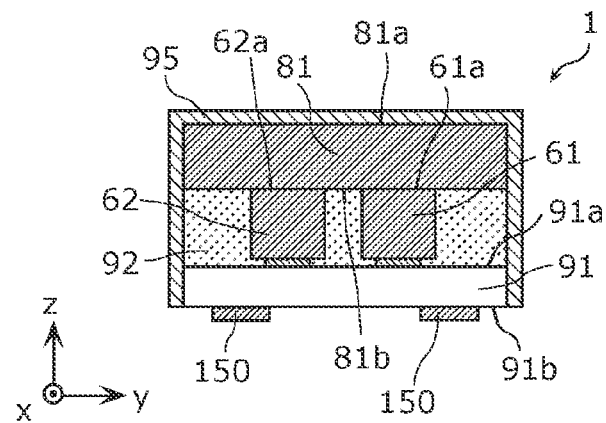
FIG. 4 is a sectional view of the radio frequency module according to Embodiment.

As illustrated in FIGS. 2 to 4, the radio frequency module 1 includes, in addition to the circuit configuration illustrated in FIG. 1, the module substrate 91, a resin member 92, a metal shield layer 95, and external connection terminals 150. The radio frequency module 1 also includes metal shield walls 81 to 83.

The module substrate 91 has a principal surface 91a and a principal surface 91b opposite to the principal surface 91a. Although the module substrate 91 has a rectangular shape when viewed in plan, the shape of the module substrate 91 is not limited thereto. As the module substrate 91, for example, a low temperature co-fired ceramics (LTCC) substrate, a high temperature co-fired ceramics (HTCC) substrate, a component-embedded substrate, a substrate having a redistribution layer (RDL), a printed substrate, or the like can be used, the above-described substrates having a layered structure of a plurality of dielectric layers, but the module substrate 91 is not limited thereto.

The principal surface 91a may be referred to as an upper surface or a front surface. As illustrated in FIG. 2, all components (excluding terminals) constituting the circuit illustrated in FIG. 1 are arranged on a principal surface 91a side. To be specific, the power amplifier 10, the low noise amplifier 20, the matching circuits 31, 32, 41, and 42, the switches 51 to 53, and the duplexers 61 and 62 are arranged on the principal surface 91a side. Also arranged on the principal surface 91a side are the metal shield walls 82 and 83. The metal shield wall 81 is disposed on at least one of the components arranged on the principal surface 91a side.

The low noise amplifier 20 and the switch 53 are included in one semiconductor integrated circuit 70. The semiconductor integrated circuit 70 is an electronic component having electronic circuits formed on a surface and inside of a semiconductor chip (also referred to as a die). The semiconductor integrated circuit 70 is configured using a complementary metal oxide semiconductor (CMOS), for example, and is specifically fabricated using a silicon on insulator (SOI) process. Thus, the semiconductor integrated circuit 70 can be manufactured at low costs. At least one of GaAs, SiGe, and GaN is used as a material for the semiconductor integrated circuit 70. Thus, the semiconductor integrated circuit 70 having high quality can be obtained. The low noise amplifier 20 and the switch 53 may be arranged on the principal surface 91a side as separate circuit components.

The principal surface 91b may be referred to as a lower surface or a rear surface. A plurality of external connection terminals 150 is disposed on a principal surface 91b side.

The plurality of external connection terminals 150 includes ground terminals 150g in addition to the antenna connection terminal 100, the radio frequency input terminal 110, and the radio frequency output terminal 120 illustrated in FIG. 1. Each of the plurality of external connection terminals 150 is connected to, for example, an input/output terminal and/or a ground terminal on a motherboard (not illustrated) disposed on a negative side of the z-axis of the radio frequency module 1. Each of the plurality of external connection terminals 150 is, for example, a planar electrode formed on the principal surface 91b side, but may be a bump electrode. Alternatively, each of the plurality of external connection terminals 150 may be a post electrode penetrating a resin member covering the principal surface 91b.

The resin member 92 is an example of a sealing member, and is disposed on the principal surface 91a of the module substrate 91 to cover the principal surface 91a. To be specific, the resin member 92 is provided so as to cover side surfaces and upper surfaces of the components and side surfaces of the metal shield walls 81 to 83 arranged on the principal surface 91a side.

The metal shield layer 95 covers an upper surface 92a of the resin member 92. The upper surface 92a is a surface of the resin member 92 opposite to the side of the module substrate 91. To be specific, the metal shield layer 95 covers the upper surface 92a and side surfaces of the resin member 92 and side surfaces of the module substrate 91. Note that "cover a surface" means to cover at least part of the surface to be covered. Therefore, for example, the metal shield layer 95 may cover only a portion of the upper surface 92a of the resin member 92 and need not necessarily cover the remaining portion. The same applies to a case where another member such as the resin member 92 "covers a surface".

The metal shield layer 95 is, for example, a metal thin film formed by sputtering. The metal shield layer 95 is an example of a metal layer set to ground potential. To be specific, the metal shield layer 95 is set to the ground potential by being connected to the ground terminals 150g and a ground electrode provided in or on the module substrate 91. This reduces intrusion of external noise into the circuit components included in the radio frequency module 1.

3. Structure for Reducing Electromagnetic Field Coupling

In the radio frequency module 1 having the above circuit configuration, when at least two of the elements (for example, inductors and/or capacitors) arranged in the transmit paths AT and BT and the receive paths AR and BR are electromagnetically coupled, harmonic components of a high-output transmit signal amplified by the power amplifier 10 may be superimposed on the transmit signal, and the quality of the transmit signal may be degraded. In addition, the electromagnetic field coupling reduces the isolation between the transmission and the reception, and unwanted waves such as the harmonic components or intermodulation distortion between the transmit signal and another radio frequency signal may flow into the receive path, degrading reception sensitivity.

In contrast, the radio frequency module 1 according to the present embodiment has a configuration to reduce the electromagnetic field coupling between components, between terminals, and between a component and a terminal. To be specific, in the radio frequency module 1, the metal shield walls 81 to 83 are provided upright.

The metal shield wall 81 is an example of a first metal wall disposed on an upper surface of a first component and set to the ground potential. In the present embodiment, the metal shield wall 81 is disposed across the upper surface of the first component and an upper surface of a fourth component. Both the first component and the fourth component are components arranged on the principal surface 91a side of the module substrate 91. In the present embodiment, the duplexer 61 is an example of the first component, and the duplexer 62 is an example of the fourth component.

As illustrated in FIGS. 3 and 4, an upper end 81a of the metal shield wall 81 is in contact with the metal shield layer 95. The metal shield wall 81 is electrically connected to the metal shield layer 95 and set to the ground potential, by being in contact with the metal shield layer 95. Thus, the metal shield wall 81 can reduce the electromagnetic field coupling between components or terminals located on both sides of the metal shield wall 81. That is, the metal shield wall 81 has a shielding function (electromagnetic shielding function).

The metal shield wall 81 is disposed between terminals 61c and 61d of the duplexer 61 when viewed in plan. Thus, the metal shield wall 81 can reduce the electromagnetic field coupling between the terminals 61c and 61d. To be specific, the metal shield wall 81 reduces the flow of radio frequency signals flowing through one of the terminals 61c and 61d to the other by passing between the duplexer 61 and the metal shield layer 95. Therefore, the noise interference between the terminals can be reduced.

The terminals 61c and 61d are examples of a first terminal and a second terminal included in the first component, respectively, and are terminals connected to the module substrate 91. As illustrated in FIG. 3, the terminals 61c and 61d are electrically connected to the module substrate 91 by being in contact with, for example, via conductors provided inside the module substrate 91 (not illustrated in FIG. 4). At least one of the terminals 61c and 61d may be connected to the module substrate 91 by being in contact with a conductive pattern provided on the front surface of the module substrate 91.

The terminals 61c and 61d are not ground terminals but are, for example, input and output terminals for radio frequency signals, respectively. For example, the terminal 61c is an input terminal of the transmit filter 61T of the duplexer 61 (a terminal connected to the matching circuit 31). The terminal 61d is an output terminal of the receive filter 61R of the duplexer 61 (a terminal connected to the matching circuit 41). In this case, the metal shield wall 81 can improve the isolation between the transmission and the reception.

Alternatively, one of the terminals 61c and 61d may be an input/output terminal of the duplexer 61 (a terminal connected to the terminal 512 of the switch 51). This can reduce the degradation of the quality of the transmit signal due to, for example, the superimposition of the harmonic components of the high-output transmit signal amplified by the power amplifier 10 on the transmit signal. Alternatively, it is possible to reduce the decrease in reception sensitivity caused by unwanted waves such as the harmonic components or intermodulation distortion between the transmit signal and another radio frequency signal, flowing into the receive path.

As illustrated in FIGS. 2 and 4, a lower end 81b of the metal shield wall 81 is in contact with each of an upper surface 61a of the duplexer 61 and an upper surface 62a of the duplexer 61. The upper surface 61a of the duplexer 61 and the upper surface 62a of the duplexer 62 may be made of a conductive member or an insulating member. For example, each of the upper surfaces 61a and 62a may be covered with a metal material and may be electrically connected to the ground potential provided on the principal surface 91a side of the module substrate 91. In this case, the metal shield wall 81 is supplied with the ground potential from both the upper end 81a and the lower end 81b, thus strengthening the grounding of the metal shield wall 81 and enhancing the shielding function of the metal shield wall 81.

In addition, since the metal shield wall 81 is made of metal, the metal shield wall 81 has high thermal conductivity. Therefore, the metal shield wall 81 can release the heat generated in the duplexers 61 and 62 to the metal shield layer 95. This can enhance the heat dissipation of the radio frequency module 1.

In the present embodiment, the metal shield wall 81 extends from one end to the other end of the duplexer 61 when viewed in plan. To be specific, the metal shield wall 81 extends linearly along the y-axis. To be more specific, the metal shield wall 81 extends along the y-axis across the upper surface 61a of the duplexer 61 and the upper surface 62a of the duplexer 62, and is in contact with side wall portions of the metal shield layer 95 at both positive and negative ends of the y-axis. This supplies the ground potential to the metal shield wall 81 from the sides as well, thus strengthening the grounding of the metal shield wall 81 and enhancing the shielding function of the metal shield wall 81. The metal shield wall 81 can also reduce the electromagnetic field coupling between two terminals of the duplexer 62 and the electromagnetic field coupling between the terminals of the duplexer 61 and the terminals of the duplexer 62.

As illustrated in FIG. 4, a space located between the duplexer 61 and the duplexer 62 and below the metal shield wall 81 is filled with the resin member 92. The lower end 81b of the metal shield wall 81 may extend toward the principal surface 91a of the module substrate 91 between the duplexer 61 and the duplexer 62. For example, the lower end 81b of the metal shield wall 81 may be in contact with the principal surface 91a of the module substrate 91 between the duplexer 61 and the duplexer 62. This enhances the shielding function of the metal shield wall 81. The same applies to a space between the duplexer 61 and the side wall portion of the metal shield layer 95 (a portion on a positive side of the y-axis) and a space between the duplexer 62 and the side wall portion of the metal shield layer 95 (a portion on a negative side of the y-axis).

The metal shield wall 81 can reduce not only the electromagnetic field coupling between the terminals of the duplexers 61 and 62 but also the electromagnetic field coupling between components and terminals arranged in a region on a positive side of the x-axis and components and terminals arranged in a region on a negative side of the x-axis, with respect to the metal shield wall 81. For example, as illustrated in FIG. 2, the metal shield wall 81 can reduce the electromagnetic field coupling between the matching circuits 31 and 32 and the matching circuits 41 and 42. Also, the metal shield wall 81 can reduce the electromagnetic field coupling between the matching circuits 31 and 32 and the terminal 61d of the duplexer 61 and the electromagnetic field coupling between the matching circuits 41 and 42 and the terminal 61c of the duplexer 61.

The metal shield wall 82 is an example of a second metal wall set to the ground potential, and is disposed on the principal surface 91a side of the module substrate 91. As illustrated in FIG. 3, an upper end 82a of the metal shield wall 82 is in contact with the metal shield layer 95. The metal shield wall 82 is electrically connected to the metal shield layer 95 and set to the ground potential, by being in contact with the metal shield layer 95. Thus, the metal shield wall 82 can reduce the electromagnetic field coupling between components or terminals located on both sides of the metal shield wall 82. That is, the metal shield wall 82 has a shielding function.

The metal shield wall 82 is disposed between the first component and a second component when viewed in plan. The second component is a component disposed on the principal surface 91a side of the module substrate 91 and is, for example, the power amplifier 10, the matching circuit 31 or 32, or the switch 52. Thus, the metal shield wall 82 can reduce the electromagnetic field coupling between the duplexer 61 and each of the power amplifier 10, the matching circuits 31 and 32, and the switch 52.

In the present embodiment, as illustrated in FIG. 3, a lower end 82b of the metal shield wall 82 is connected to the ground terminal 150g through a via conductor penetrating the module substrate 91. This supplies the ground potential to the metal shield wall 82 from both the upper end 82a and the lower end 82b, thus strengthening the grounding of the metal shield wall 82 and enhancing the shielding function. The metal shield wall 82 is disposed in parallel with the metal shield wall 81 when viewed in plan. That is, the metal shield wall 82 extends linearly along the y-axis when viewed in plan. At this time, as illustrated in FIG. 2, the metal shield wall 82 is not in contact with the side wall portions of the metal shield layer 95 on both the positive side and the negative side of the y-axis, but the positional relationship between the metal shield wall 82 and the metal shield layer 95 is not limited thereto. The metal shield wall 82 may be in contact with the side wall portion of the metal shield layer 95 at at least one end portion of the positive side and the negative side of the y-axis.

The metal shield wall 83 is an example of a third metal wall set to the ground potential, and is disposed on the principal surface 91a side of the module substrate 91. As illustrated in FIG. 3, an upper end 83a of the metal shield wall 83 is in contact with the metal shield layer 95. The metal shield wall 83 is electrically connected to the metal shield layer 95 and set to the ground potential, by being in contact with the metal shield layer 95. Thus, the metal shield wall 83 can reduce the electromagnetic field coupling between components or terminals located on both sides of the metal shield wall 83. That is, the metal shield wall 83 has a shielding function.

The metal shield wall 83 is disposed between the first component and a third component when viewed in plan. The third component is a component disposed on the principal surface 91a side of the module substrate 91, and is, for example, the matching circuit 41 or 42, the switch 51, or the semiconductor integrated circuit 70. Thus, the metal shield wall 83 can reduce the electromagnetic field coupling between the duplexer 61 and each of the matching circuits 41 and 42, the switch 51, and the semiconductor integrated circuit 70.

In the present embodiment, as illustrated in FIG. 3, a lower end 83b of the metal shield wall 83 is connected to the ground terminal 150g through a via conductor penetrating the module substrate 91. This supplies the ground potential to the metal shield wall 83 from both the upper end 83a and the lower end 83b, thus strengthening the grounding of the metal shield wall 83 and enhancing the shielding function.

The metal shield wall 83 is disposed in parallel with the metal shield wall 81 when viewed in plan. That is, the metal shield wall 83 extends linearly along the y-axis when viewed in plan. At this time, as illustrated in FIG. 2, the metal shield wall 83 is not in contact with the side wall portions of the metal shield layer 95 on both the positive side and the negative side of the y-axis, but the positional relationship between the metal shield wall 83 and the metal shield layer 95 is not limited thereto. The metal shield wall 83 may be in contact with the side wall portion of the metal shield layer 95 at at least one end portion of the positive side and the negative side of the y-axis.

At least one of the metal shield walls 82 and 83 does not necessarily have to be parallel to the metal shield wall 81 when viewed in plan.

According to the radio frequency module 1 of the present embodiment, the three metal shield walls 81 to 83 can more strongly reduce the electromagnetic field coupling between the components and between the terminals. For example, the three metal shield walls 81 to 83 arranged between the matching circuits 31 and 32 and the matching circuits 41 and 42 can more strongly reduce the electromagnetic field coupling between these matching circuits.

Each of the metal shield walls 81 to 83 is a flat metal member. The lower end 81b of the metal shield wall 81 is fixed to the respective upper surfaces 61a and 62a of the duplexers 61 and 62. The lower ends 82b and 83b of the metal shield walls 82 and 83 are fixed to the principal surface 91a of the module substrate 91. They are fixed using a conductive adhesive such as solder. Note that at least one of the metal shield walls 81 to 83 may be a metal wall grown by plating.

A height of the metal shield wall 81 is different from heights of the metal shield walls 82 and 83. The height of the metal shield wall 81 corresponds to a distance between the lower end 81b and the upper end 81a. The same applies to the metal shield walls 82 and 83. The height of the metal shield wall 82 is equal to the height of the metal shield wall 83. The height of the metal shield wall 81 corresponds to a difference between the height of the metal shield wall 82 and a height of the duplexer 61 (first component). Accordingly, the distances from the principal surface 91a of the module substrate 91 to the respective upper ends 81a to 83a of the metal shield walls 81 to 83 are equal.

After fixing the metal shield walls 81 to 83, the resin member 92 can be formed by filling a space above the principal surface 91a and above the components fixed to the principal surface 91a with a resin material from which the resin member 92 is made and curing the resin material. By polishing the formed resin member 92, the upper ends 81a to 83a of the metal shield walls 81 to 83 are exposed. At this time, the metal shield walls 81 to 83 may also be polished. Accordingly, the upper surface 92a of the resin member 92 and the respective upper ends 81a to 83a of the metal shield walls 81 to 83 become flush with one another. The metal shield layer 95 is formed by sputtering on the upper surface 92a and the upper ends 81a to 83a, which have been made flush with one another by polishing. Accordingly, the metal shield walls 81 to 83 are each in contact with and are electrically connected to the metal shield layer 95.

The upper ends 81a to 83a are tip portions of the metal shield walls 81 to 83, respectively in an upright direction (a direction away from the principal surface 91a along the normal of the principal surface 91a, that is, upward). The lower ends 81b to 83b are end portions of the metal shield walls 81 to 83, respectively, opposite to the upper ends 81a to 83a. In the present embodiment, the upper ends 81a to 83a are upper end faces of the metal shield walls 81 to 83, respectively, but are not limited thereto. For example, the metal shield walls 81 to 83 may be laterally placed triangular prisms, or pyramids, and the upper ends 81a to 83a may be straight segments or single points.

4. Modifications

Next, Modifications of the radio frequency module 1 according to Embodiment will be described.

4-1. Modification 1

Figure 5:
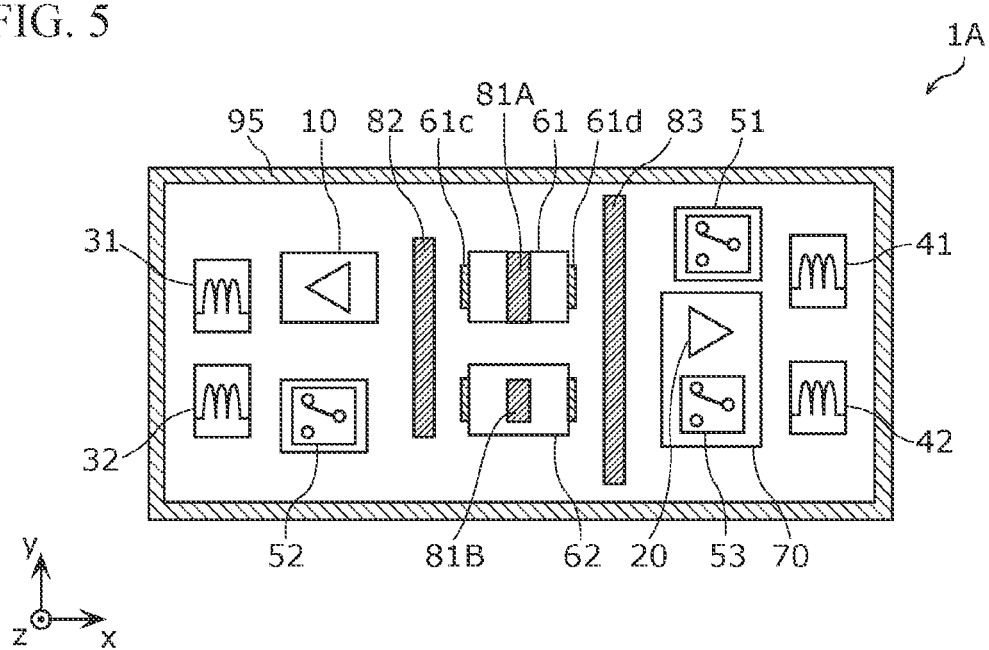
FIG. 5 is a plan view of a radio frequency module according to Modification 1.

FIG. 5 is a plan view of a radio frequency module 1A according to Modification 1 of Embodiment. The radio frequency module 1A illustrated in FIG. 5 includes metal shield walls 81A and 81B instead of the metal shield wall 81.

The metal shield wall 81A is disposed only on the upper surface 61a of the duplexer 61. The metal shield wall 81A extends from one end to the other end of the duplexer 61 when viewed in plan.

The metal shield wall 81B is disposed only on the upper surface 62a of the duplexer 62. The metal shield wall 81B is disposed inside the duplexer 62 and does not extend to the end portions of the duplexer 62 when viewed in plan.

Thus, as in the radio frequency module 1A according to the present modification, the metal shield wall does not have to extend across a plurality of components, and may be disposed only on an upper surface of a single component. The metal shield wall does not have to extend from one end to the other end of the component when viewed in plan. Even in this case, the metal shield wall disposed on the single component can reduce the electromagnetic field coupling between the terminals of the corresponding component and can enhance the heat dissipation of the corresponding component.

4-2. Modification 2

Figure 6:
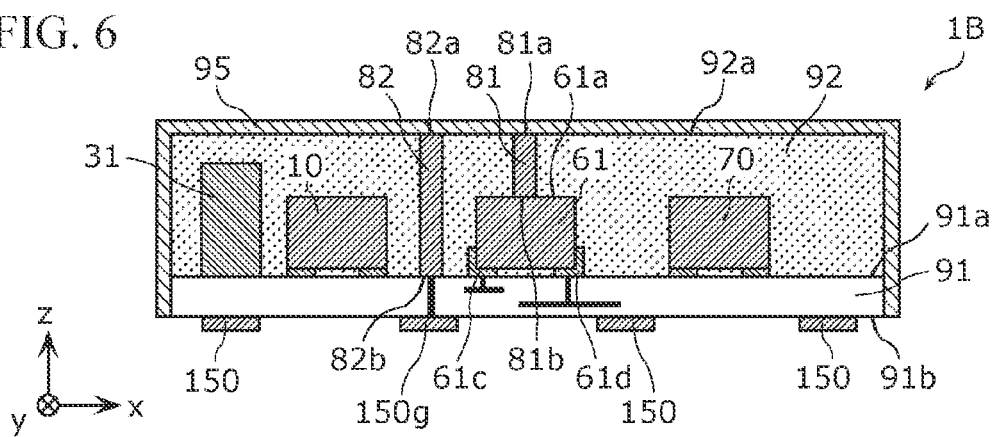
FIG. 6 is a sectional view of a radio frequency module according to Modification 2.

FIG. 6 is a sectional view of a radio frequency module 1B according to Modification 2 of Embodiment. The radio frequency module 1B illustrated in FIG. 6 does not include the metal shield wall 83 as compared with the radio frequency module 1 illustrated in FIG. 3. The matching circuit 41 is not disposed in a region on the positive side of the x-axis with respect to the metal shield wall 81.

Even when the metal shield wall 83 is not provided, the metal shield wall 81 is disposed between the semiconductor integrated circuit 70 (the low noise amplifier 20 and the switch 53) and the terminal 61c of the duplexer 61. Thus, the metal shield wall 81 can reduce the electromagnetic field coupling between the semiconductor integrated circuit 70 and the terminal 61c.

The metal shield walls 81 and 82 are arranged between the semiconductor integrated circuit 70 and each of the power amplifier 10 and the matching circuit 31. Thus, the electromagnetic field coupling between the semiconductor integrated circuit 70 and each of the power amplifier 10 and the matching circuit 31 can be reduced.

4-3. Modification 3

Figure 7:
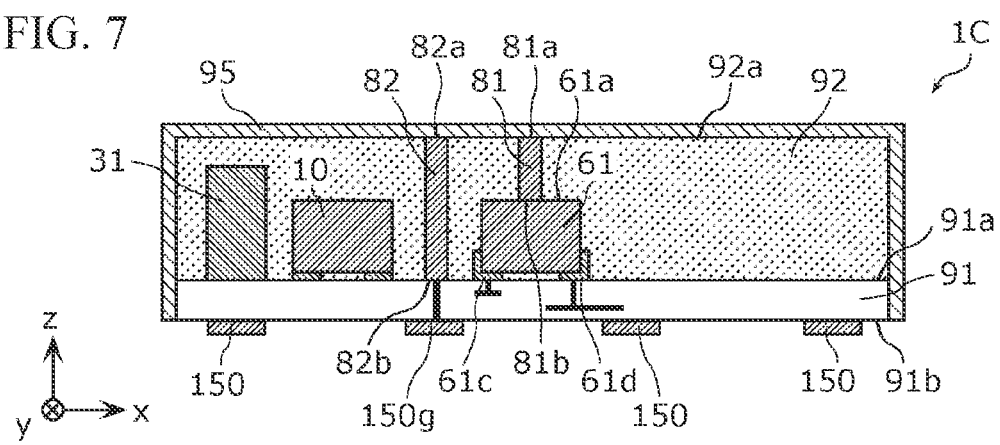
FIG. 7 is a sectional view of a radio frequency module according to Modification 3.

FIG. 7 is a sectional view of a radio frequency module 1C according to Modification 3 of Embodiment. In the radio frequency module 1C illustrated in FIG. 7, as compared with the radio frequency module 1B illustrated in FIG. 6, the semiconductor integrated circuit 70 and the matching circuit 41 are not arranged in a region on the positive side of the x-axis with respect to the metal shield wall 81. That is, in the radio frequency module 1C, no components constituting the radio frequency module 1C are arranged in a region on one side with respect to the metal shield wall 81 except for the component (duplexer 61) located directly below the metal shield wall 81.

Even in this case, the metal shield wall 82 can reduce the electromagnetic field coupling between the duplexer 61 and each of the matching circuit 31 and the power amplifier 10. In addition, the metal shield wall 81 can reduce the electromagnetic field coupling between the terminal 61d of the duplexer 61 and each of the terminal 61c of the duplexer 61, the matching circuit 31, and the power amplifier 10.

4-4. Modification 4

Figure 8:
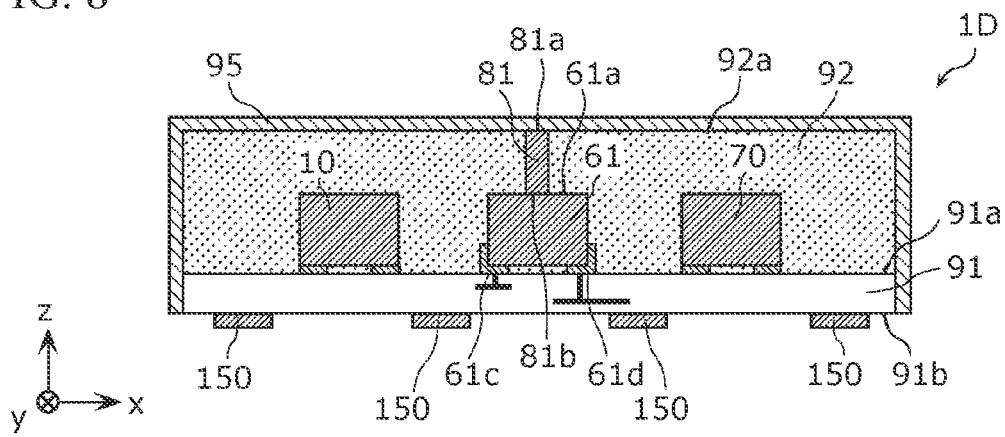
FIG. 8 is a sectional view of a radio frequency module according to Modification 4.

FIG. 8 is a sectional view of a radio frequency module 1D according to Modification 4 of Embodiment. The radio frequency module 1D illustrated in FIG. 8 does not include the metal shield wall 82 as compared with the radio frequency module 1B illustrated in FIG. 6. The matching circuit 31 is not disposed in a region on the negative side of the x-axis with respect to the metal shield wall 81.

Even when the metal shield walls 82 and 83 are not provided, the metal shield wall 81 can reduce the electromagnetic field coupling between the power amplifier 10 and each of the terminal 61d of the duplexer 61 and the semiconductor integrated circuit 70. In addition, the metal shield wall 81 can reduce the electromagnetic field coupling between the semiconductor integrated circuit 70 and the terminal 61c of the duplexer 61. In addition, the metal shield wall 81 can enhance the heat dissipation of the duplexer 61.

4-5. Modification 5

Figure 9:
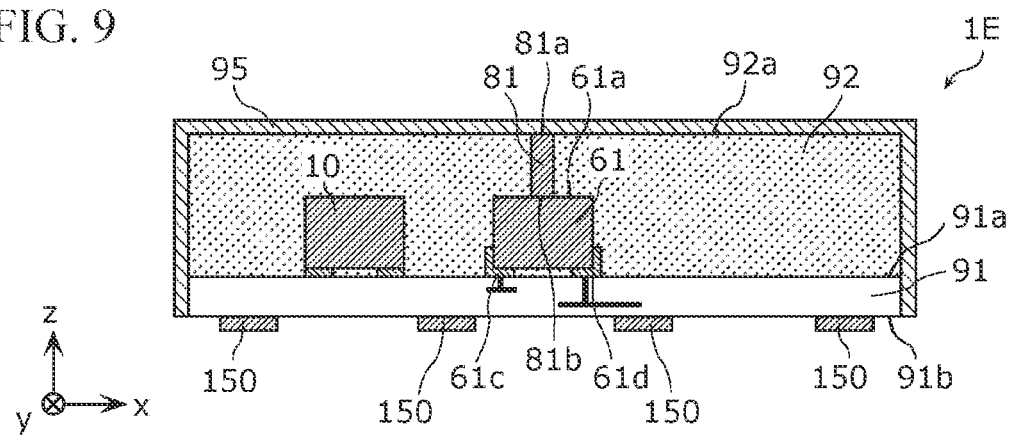
FIG. 9 is a sectional view of a radio frequency module according to Modification 5.

FIG. 9 is a sectional view of a radio frequency module 1E according to Modification 5 of Embodiment. In the radio frequency module 1E illustrated in FIG. 9, as compared with the radio frequency module 1D illustrated in FIG. 8, the semiconductor integrated circuit 70 is not disposed in a region on the positive side of the x-axis with respect to the metal shield wall 81.

Even in this case, the metal shield wall 81 can reduce the electromagnetic field coupling between the power amplifier 10 and the terminal 61d of the duplexer 61. In addition, the metal shield wall 81 can enhance the heat dissipation of the duplexer 61.

4-6. Modification 6

Figure 10:
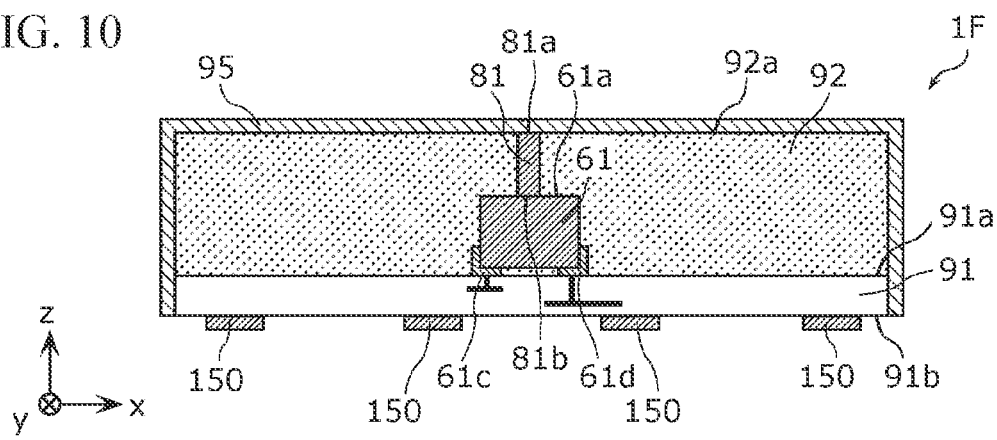
FIG. 10 is a sectional view of a radio frequency module according to Modification 6.

FIG. 10 is a sectional view of a radio frequency module 1F according to Modification 6 of Embodiment. In the radio frequency module 1F illustrated in FIG. 10, as compared with the radio frequency module 1E illustrated in FIG. 9, the power amplifier 10 is not disposed in a region on the negative side of the x-axis with respect to the metal shield wall 81. That is, in the radio frequency module 1F, no components constituting the radio frequency module 1C are arranged in regions on both sides with respect to the metal shield wall 81 except for the component (duplexer 61) located directly below the metal shield wall 81.

Even in this case, the metal shield wall 81 can reduce the electromagnetic field coupling between the terminals 61*c* and 61*d* of the duplexer 61.

5. Effects and Others

As described above, each of the radio frequency modules according to the present embodiment and the modifications thereof includes the module substrate 91, the first component disposed on the principal surface 91*a* side of the module substrate 91, the metal shield wall 81 disposed on the upper surface of the first component, the resin member 92 covering the principal surface 91*a* of the module substrate 91, the upper surface and side surface of the first component, and the side surface of the metal shield wall 81, and the metal shield layer 95 covering the upper surface 92*a* of the resin member 92. The upper end 81*a* of the metal shield wall 81 is in contact with the metal shield layer 95. The first component includes the first terminal and the second terminal both connected to the module substrate 91. When the principal surface 91*a* is viewed in plan, the metal shield wall 81 is disposed between the first terminal and the second terminal.

This can reduce the electromagnetic field coupling between the terminals of the first component, thus reducing the noise interference between the terminals. In addition, since the upper surface of the first component is used for disposing the metal shield wall 81, an area dedicated to the metal shield wall 81 is not necessary on the principal surface 91*a* of the module substrate 91, thus ensuring a mounting area for the components. Therefore, for example, more components can be mounted, or the radio frequency module can be reduced in size. Further, the heat generated in the first component can be released to the metal shield layer 95 via the metal shield wall 81, thus enhancing the heat dissipation of the radio frequency module.

For example, the radio frequency module 1 further includes the second component disposed on the principal surface 91*a* side of the module substrate 91. The metal shield wall 81 is disposed between the second component and the first terminal or between the second component and the second terminal when the principal surface 91*a* is viewed in plan.

This can reduce the electromagnetic field coupling between one of the two terminals of the first component and the second component, thus reducing the noise interference between the component and the terminal.

For example, the radio frequency module 1 further includes the metal shield wall 82 disposed on the principal surface 91*a* side of the module substrate 91. The upper end 82*a* of the metal shield wall 82 is in contact with the metal shield layer 95. The metal shield wall 82 is disposed between the second component and the first component when the principal surface 91*a* is viewed in plan.

Thus, the metal shield wall 82 can reduce the electromagnetic field coupling between the first component and the second component, thus reducing the noise interference between the components. In addition, since two metal shield walls exist between one of the two terminals of the first component and the second component, the electromagnetic field coupling between the terminal and the second component can be more strongly reduced.

For example, the height of the metal shield wall 81 is different from the height of the metal shield wall 82.

Thus, for example, by making the height of the metal shield wall 81 lower than the height of the metal shield wall 82 by the height of the first component, the distances from the principal surface 91*a* of the module substrate 91 to the upper ends 81*a* and 82*a* can be made equal. Thus, a difference in level between the upper surface 92*a* of the resin member 92 and the upper ends 81*a* and 82*a* can be eliminated.

For example, the radio frequency module 1 further includes the third component disposed on the principal surface 91*a* side of the module substrate 91. The first component is disposed between the second component and the third component when the principal surface 91*a* is viewed in plan.

Thus, the metal shield wall 81 can reduce the electromagnetic field coupling between the second component and the third component, thus reducing the noise interference between the components.

For example, the radio frequency module 1 further includes the metal shield wall 83 disposed on the principal surface 91*a* side of the module substrate 91. The metal shield wall 83 is disposed between the third component and the first component when the principal surface 91*a* is viewed in plan.

Thus, the metal shield wall 83 can reduce the electromagnetic field coupling between the first component and the third component, thus reducing the noise interference between the components. In addition, since two metal shield walls exist between the other of the two terminals of the first component and the third component, the electromagnetic field coupling between the terminal and the third component can be more strongly reduced.

For example, one of the second component and the third component is disposed in the transmit path AT or BT that transmits the transmit signal, and the other of the second component and the third component is disposed in the receive path AR or BR that transmits the receive signal.

This reduces the noise interference between transmission and reception, thereby enhancing the isolation between the transmission and the reception. In addition, the degradation of the reception sensitivity can be reduced.

The second component or the third component may be disposed in a transmit/receive path through which the transmit signal and the receive signal are transmitted. For example, in a case that the second component disposed in the transmit path and the third component disposed in the transmit/receive path are electromagnetically coupled, the harmonic components amplified by the power amplifier 10 may be transmitted from the antenna 2 without being removed by a filter or the like, resulting in the degradation of the quality of the transmit signal. By reducing the electromagnetic field coupling with the metal shield wall, the degradation of the quality of the transmit signal can be reduced. In addition, for example, in a case that the second component disposed in the receive path and the third component disposed in the transmit/receive path are electromagnetically coupled, the high-output transmit signal amplified by the power amplifier 10 and the harmonic components thereof may flow into the receive path, degrading reception sensitivity. By reducing the electromagnetic field coupling with the metal shield wall, the isolation between the transmission and the reception can be enhanced, thereby reducing the degradation of the reception sensitivity.

For example, the first component is a filter having a predetermined pass band.

This can enhance the heat dissipation of the filter, thus enhancing the quality of the bandpass characteristics of the filter.

For example, the metal shield wall 81 extends from one end to the other end of the first component when the principal surface 91*a* is viewed in plan.

This enhances the shielding function of the metal shield wall 81, thereby reducing the electromagnetic field coupling between the terminals more strongly.

For example, the radio frequency module 1 further includes the fourth component disposed on the principal surface 91*a* side of the module substrate 91. The metal shield wall 81 is disposed across the upper surface of the first component and the upper surface of the fourth component.

Thus, the single metal shield wall 81 can reduce the electromagnetic field coupling between the terminals of the plurality of components.

For example, in the radio frequency module 1, the metal shield layer 95 further covers the side surface of the resin member 92. The metal shield wall 81 is also in contact with the metal shield layer 95 at the portion of the metal shield layer 95 covering the side surface of the resin member 92.

This enhances the shielding function of the metal shield wall 81, thereby reducing the electromagnetic field coupling between the terminals more strongly.

The communication device 5 according to the present embodiment includes the RFIC 3 that processes a radio frequency signal to be transmitted and received by the antenna 2, and the radio frequency module 1 that transmits the radio frequency signal between the antenna 2 and the RFIC 3.

Thus, as in the radio frequency module 1, the mounting area for components can be ensured and the noise interference can be reduced.

(Others)

Although the radio frequency module and the communication device according to the present disclosure have been described based on Embodiment and Modifications thereof described above, the present disclosure is not limited to Embodiment described above.

For example, the first component and the fourth component arranged directly below the metal shield wall 81 do not necessarily have to be the duplexers 61 and 62. One of the first component and the fourth component may be the power amplifier 10 or the low noise amplifier 20. Alternatively, one of the first component and the fourth component may be one of the switches 51 to 53.

For example, at least one of the metal shield walls 81 to 83 does not have to extend linearly when viewed in plan. For example, at least one of the metal shield walls 81 to 83 may be bent in an L shape or a U shape when viewed in plan. Alternatively, at least one of the metal shield walls 81 to 83 may be provided in an annular shape surrounding one or more components. In these cases, the metal shield wall may be bent at 90° or may be smoothly curved. At least one of the metal shield walls 81 to 83 does not necessarily have to be continuous in an extending direction thereof, and may be divided into several parts.

For example, although the circuit components constituting the radio frequency module are arranged on only one principal surface side of the module substrate 91, the circuit components may be divided into two groups and arranged on the two principal surface sides of the module substrate 91. That is, the circuit components may be mounted using one side or both sides of the module substrate 91.

In addition, the present disclosure includes embodiments obtained by applying various modifications conceived by those skilled in the art to Embodiment and Modifications, and embodiments implemented by appropriately combining constituent elements and functions in Embodiment and Modifications without departing from the gist of the present disclosure.

The present disclosure can be widely used in communication devices such as mobile phones by being employed in a radio frequency module disposed in a multi-band front end.

1, 1A, 1B, 1C, 1D, 1E, 1F Radio Frequency Module
2 Antenna
3 RFIC
4 BBIC
5 Communication Device
10 Power Amplifier
20 Low Noise Amplifier
31, 32, 41, 42 Matching Circuit
51, 52, 53 Switch
61, 62 Duplexer
61*a*, 62*a*, 92*a* Upper Surface
61*c*, 61*d* Terminal
61R, 62R Receive Filter
61T, 62T Transmit Filter
70 Semiconductor Integrated Circuit
81, 81A, 81B, 82, 83 Metal Shield Wall
81*a*, 82*a*, 83*a* Upper End
81*b*, 82*b*, 83*b* Lower End
91 Module Substrate
91*a*, 91*b* Principal Surface
92 Resin Member
95 Metal Shield Layer
100 Antenna Connection Terminal
110 Radio Frequency Input Terminal
120 Radio Frequency Output Terminal
150 External Connection Terminal
150*g* Ground Terminal
511, 512, 513, 521, 522, 523, 531, 532, 533 Terminal
AR, BR Receive Path
AT, BT Transmit Path

The invention claimed is:

1. A radio frequency module comprising:
 a module substrate;
 a first component disposed on a principal surface of the module substrate;
 a first metal wall disposed on an upper surface of the first component and set to ground potential;
 a resin member covering the principal surface of the module substrate, the upper surface and a side surface of the first component, and a side surface of the first metal wall; and
 a metal layer set to the ground potential and covering an upper surface of the resin member,
 wherein an upper end of the first metal wall is in contact with the metal layer,
 the first component includes a first terminal and a second terminal both connected to the module substrate, and
 when the principal surface is viewed in plan, the first metal wall is disposed between the first terminal and the second terminal.

2. The radio frequency module according to claim 1 further comprising:
 a second component disposed on the principal surface of the module substrate,
 wherein the first metal wall is disposed between the second component and the first terminal or between the second component and the second terminal when the principal surface is viewed in plan.

3. The radio frequency module according to claim 2 further comprising:

a second metal wall disposed on the principal surface of the module substrate and set to the ground potential,
wherein an upper end of the second metal wall is in contact with the metal layer, and
the second metal wall is disposed between the second component and the first component when the principal surface is viewed in plan.

4. The radio frequency module according to claim 3,
wherein a height of the first metal wall is different from a height of the second metal wall.

5. The radio frequency module according to claim 3 further comprising:
a third component disposed on the principal surface of the module substrate,
wherein the first component is disposed between the second component and the third component when the principal surface is viewed in plan.

6. The radio frequency module according to claim 3,
wherein the first component is a filter having a predetermined pass band.

7. The radio frequency module according to claim 4 further comprising:
a third component disposed on the principal surface of the module substrate,
wherein the first component is disposed between the second component and the third component when the principal surface is viewed in plan.

8. The radio frequency module according to claim 4,
wherein the first component is a filter having a predetermined pass band.

9. The radio frequency module according to claim 2 further comprising:
a third component disposed on the principal surface of the module substrate,
wherein the first component is disposed between the second component and the third component when the principal surface is viewed in plan.

10. The radio frequency module according to claim 9 further comprising:
a third metal wall disposed on the principal surface of the module substrate and set to the ground potential,
wherein the third metal wall is disposed between the third component and the first component when the principal surface is viewed in plan.

11. The radio frequency module according to claim 10,
wherein one of the second component and the third component is disposed in a transmit path through which a transmit signal is transmitted, and
another of the second component and the third component is disposed in a receive path through which a receive signal is transmitted.

12. The radio frequency module according to claim 10,
wherein the first component is a filter having a predetermined pass band.

13. The radio frequency module according to claim 9,
wherein one of the second component and the third component is disposed in a transmit path through which a transmit signal is transmitted, and
another of the second component and the third component is disposed in a receive path through which a receive signal is transmitted.

14. The radio frequency module according to claim 9,
wherein the first component is a filter having a predetermined pass band.

15. The radio frequency module according to claim 2,
wherein the first component is a filter having a predetermined pass band.

16. The radio frequency module according to claim 1,
wherein the first component is a filter having a predetermined pass band.

17. The radio frequency module according to claim 1,
wherein the first metal wall extends from one end to another end of the first component when the principal surface is viewed in plan.

18. The radio frequency module according to claim 1 further comprising:
a fourth component disposed on the principal surface of the module substrate,
wherein the first metal wall is disposed across the upper surface of the first component and an upper surface of the fourth component.

19. The radio frequency module according to claim 1,
wherein the metal layer further covers a side surface of the resin member, and
the first metal wall is further in contact with the metal layer at a portion of the metal layer covering the side surface of the resin member.

20. A communication device comprising:
an RF signal processing circuit configured to process a radio frequency signal transmitted and received by an antenna; and
the radio frequency module according to claim 1, configured to transmit the radio frequency signal between the antenna and the RF signal processing circuit.

* * * * *